US012658113B2

(12) United States Patent
Huang et al.

(10) Patent No.: US 12,658,113 B2
(45) Date of Patent: Jun. 16, 2026

(54) DISPLAY SUBSTRATE, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yao Huang, Beijing (CN); Yuanyou Qiu, Beijing (CN); Pinchao Gu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/956,163

(22) Filed: Nov. 22, 2024

(65) Prior Publication Data

US 2025/0095558 A1      Mar. 20, 2025

Related U.S. Application Data

(63) Continuation-in-part of application No. 17/426,172, filed as application No. PCT/CN2020/123743 on Oct. 26, 2020, now abandoned.

(51) Int. Cl.
G09G 3/3233 (2016.01)
G09G 3/32 (2016.01)
(Continued)

(52) U.S. Cl.
CPC ............. G09G 3/32 (2013.01); G09G 3/3233 (2013.01); H10K 59/1213 (2023.02);
(Continued)

(58) Field of Classification Search
CPC .................. G09G 3/32; G09G 3/3233; G09G 2300/0426; G09G 2320/0209;
(Continued)

(56) References Cited

U.S. PATENT DOCUMENTS

2020/0227503 A1      7/2020 Yi et al.

FOREIGN PATENT DOCUMENTS

CN      110706647 A      1/2020
CN      111668278 A      9/2020

OTHER PUBLICATIONS

Office Action received for Chinese Patent Application No. 202080002471.X, mailed on May 29, 2025, 21 pages (11 pages of English Translation and 10 pages of Original Document).

*Primary Examiner* — Julie Anne Watko
(74) *Attorney, Agent, or Firm* — ArentFox Schiff LLP; Michael Fainberg

(57) ABSTRACT

The display substrate includes a plurality of first light-emitting devices in a first display area, a plurality of second light-emitting devices in a second display area, a plurality of first pixel driving circuits in the second display area, the first pixel driving circuits are connected with the first light-emitting devices, and at least one of the plurality of pixel driving circuits is provided with a drive transistor. The display substrate further includes gate connecting electrodes connected to a gate electrode of the drive transistor; a plurality of traces, some of the traces being electrically connected from the first pixel driving circuits across the gate connecting electrodes to the first light-emitting devices; and a shielding layer including isolation parts, an orthographic projection of the isolation parts at least partially overlapping an orthographic projection of the gate connecting electrodes.

14 Claims, 16 Drawing Sheets

(51) Int. Cl.
*H10K 59/121*          (2023.01)
*H10K 59/126*          (2023.01)
*H10K 59/131*          (2023.01)

(52) U.S. Cl.
CPC ......... *H10K 59/126* (2023.02); *H10K 59/131*
(2023.02); *G09G 2300/0426* (2013.01); *G09G
2320/0209* (2013.01); *G09G 2320/0233*
(2013.01)

(58) Field of Classification Search
CPC ... G09G 2320/0233; G09G 2310/0251; G09G
2300/0876; G09G 2300/0842; G09G
2300/0819; G09G 3/3241; H10K 59/131;
H10K 59/126; H10K 59/1213
See application file for complete search history.

AA1

S

Light-emitting
side

AA2

DP

106/N1

1081        1082

108

DISPLAY SUBSTRATE, DISPLAY PANEL AND DISPLAY DEVICE

CROSS REFERENCE TO RELATED APPLICATIONS

The present disclosure is a continuation-in-part of U.S. application Ser. No. 17/426,172, filed on Jul. 28, 2021, which is a national phase entry under 35 U.S.C. § 371 of International Application No. PCT/CN2020/123743, filed Oct. 26, 2020, a part of or entire contents of which are incorporated herein by reference.

FIELD

The present disclosure relates to the field of display technology, in particular to a display substrate, a display panel and a display device.

BACKGROUND

With the rapid development of smart phones, not only is an attractive appearance required for the phones, they also need to bring a better visual experience for users of the phones. Major manufacturers have started to increase the screen-to-body ratio of smart phones, making a full-screen a new competitive point for the smart phones. With the development of full-screen technology, the demand for improvement in performance and functionality is increasing day by day. An under-panel camera can bring a sense of impact in vision and user experience to some extent without affecting a high screen-to-body ratio.

SUMMARY

In an aspect, an embodiment of the present disclosure provides an display substrate, including:

a base substrate, a display area of the base substrate includes a first display area and a second display area, a light transmittance of the first display area is greater than a light transmittance of the second display area;

a plurality of light-emitting devices arranged in an array on the base substrate, the plurality of light-emitting devices including a plurality of first light-emitting devices located in the first display area and a plurality of second light-emitting devices located in the second display area;

a plurality of pixel driving circuits disposed between the base substrate and a layer where the plurality of light-emitting devices are located, the plurality of pixel driving circuits include a plurality of first pixel driving circuits and a plurality of second pixel driving circuits, the plurality of first pixel driving circuits are correspondingly electrically connected to the plurality of first light-emitting devices, orthographic projections of the plurality of first pixel driving circuits on the base substrate do not overlap with the first display area; and the plurality of second pixel driving circuits are at least partially overlapped with and correspondingly electrically connected to the plurality of second light-emitting devices; and at least one of the plurality of pixel driving circuits is provided with a drive transistor;

gate connecting electrodes, connected to a gate electrode of the drive transistor;

a plurality of traces disposed between a layer where the plurality of pixel driving circuits are located and the layer where the plurality of light-emitting devices are located, each of at least part of the traces being electrically connected from at least one of the first pixel driving circuits and across at least one of the gate connecting electrodes to at least one of the first light-emitting devices; and a shielding layer including a plurality of isolation parts, an orthographic projection, on the base substrate, of at least one of the isolation parts at least partially overlapping an orthographic projection, on the base substrate, of at least one of the gate connecting electrodes.

In some embodiments of the present disclosure, the shielding layer is disposed between a layer where the at least part of the traces is located and a layer where the gate connecting electrodes are located.

In some embodiments of the present disclosure, the gate connecting electrodes are arranged in a first direction and extend in a second direction, and the isolation parts are arranged in the first direction and extend in the second direction.

In some embodiments of the present disclosure, the shielding layer further includes a plurality of connection parts, and each of the connection parts connects two of the isolation parts in the first direction.

In some embodiments of the present disclosure, in the second direction, a width of the isolation parts is greater than a width of the connection parts.

In some embodiments of the present disclosure, the shielding layer is disposed between a source-drain metal layer and a layer where the plurality of traces are located;

the shielding layer further includes a plurality of conductive parts independent from the plurality of connection parts and the plurality of isolation parts; and the conductive parts each connects a respective one of the traces and a respective one of the first pixel driving circuits.

In some embodiments of the present disclosure, the shielding layer is arranged in a same layer as a rest of the traces other than the at least part of the traces;

the shielding layer further includes a plurality of conductive parts independent from the plurality of connection parts and the plurality of isolation parts; and the conductive parts each connects a respective one of the at least part of the traces and a respective one of the first pixel driving circuits.

In some embodiments of the present disclosure, the isolation parts are disposed in a floating manner or applied with a DC signal.

In some embodiments of the present disclosure, the display substrate further includes a power signal line located in a source-drain metal layer and disposed adjacent to the gate connecting electrodes;

the power signal line is provided with a concave structure on a side close to the gate connecting electrodes;

the isolation parts are applied with a same signal as the power signal line;

orthographic projections, on the base substrate, of the isolation parts cover an orthographic projection of the concave structure; and the orthographic projections, on the base substrate, of the isolation part partially overlap an orthographic projection of the power signal line.

In some embodiments of the present disclosure, the display substrate further includes a power signal line located in a source-drain metal layer and disposed adjacent to the gate connecting electrodes;

the power signal line is provided with a concave structure on a side close to the gate connecting electrodes;

orthographic projections, on the base substrate, of the isolation part overlap an orthographic projection of the concave structure; and the orthographic projections, on the base substrate, of the isolation part do not overlap an orthographic projection of the power signal line.

In some embodiments of the present disclosure, a density of the plurality of first light-emitting devices in the first display area is smaller than a density of the plurality of second light-emitting devices in the second display area; and the plurality of pixel driving circuits are located in the second display area, and each of the first pixel driving circuit is located in a gap between two of the second pixel driving circuits.

In some embodiments of the present disclosure, a density of the plurality of first light-emitting devices in the first display area is equal to a density of the plurality of second light-emitting devices in the second display area:

the plurality of first pixel driving circuits are located in a border area adjacent to the first display area; and the plurality of second pixel driving circuits are located in the second display area.

In some embodiments of the present disclosure, the first display area is configured to install a light extraction module.

In some embodiments of the present disclosure, a material of the plurality of traces is a transparent conductive material.

In some embodiments of the present disclosure, the pixel driving circuits further include a threshold compensation transistor; and the gate connecting electrodes are electrically connected to a drain of the threshold compensation transistor.

In another aspect, an embodiment of the present disclosure provides a display panel including the above-mentioned display substrate.

In some embodiments of the present disclosure, the shielding layer is disposed between a layer where the at least part of the traces is located and a layer where the gate connecting electrodes are located.

In some embodiments of the present disclosure, the gate connecting electrodes are arranged in a first direction and extend in a second direction, and the isolation parts are arranged in the first direction and extend in the second direction.

In some embodiments of the present disclosure, the shielding layer further includes a plurality of connection parts, and each of the connection parts connects two of the isolation parts in the first direction.

In yet another aspect, an embodiment of the present disclosure provides a display device including a light extraction module and the above-mentioned display panel, the light extraction module is provided in a first display area of the display panel.

DETAILED DESCRIPTION OF THE EMBODIMENTS

Figure 1A:
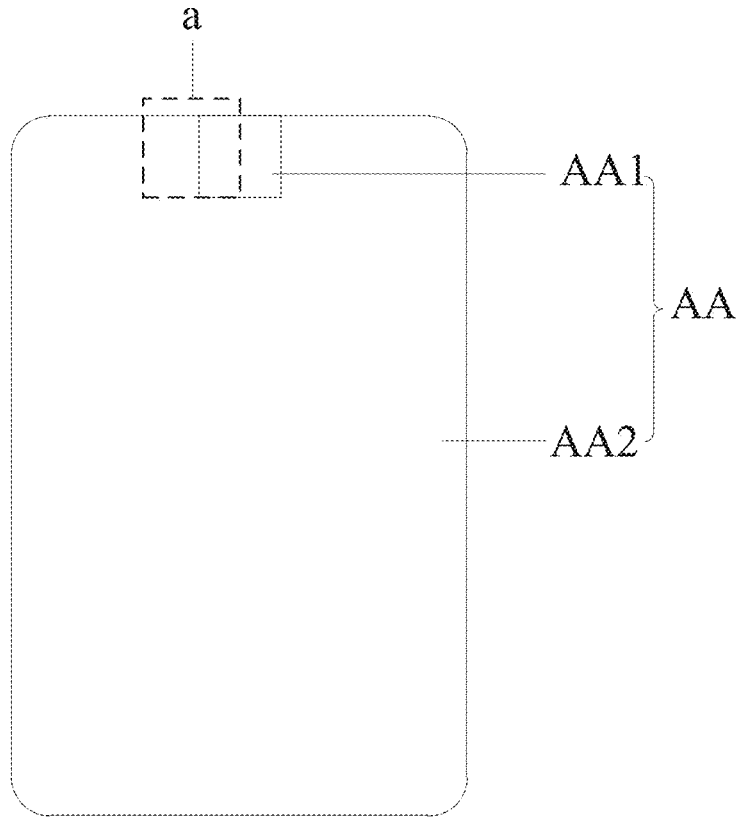
FIG. 1A is a structural diagram of a display device provided in an embodiment of the present disclosure.

To make the objectives, technical solutions and advantages of embodiments of the present disclosure clearer, the technical solutions in embodiments of the present disclosure will be described clearly and completely in conjunction with the accompanying drawings in embodiments of the present disclosure. It should be noted that sizes and shapes of graphs in the drawings do not reflect the true scale, and are merely intended to schematically illustrate the present disclosure. Furthermore, same or similar reference numerals throughout represent same or similar elements or elements having same or similar functions. Obviously, the described embodiments are only a part of embodiments of the present disclosure, and not all embodiments. Based on the described embodiments of the present disclosure, all other embodiments obtained by those of ordinary skill in the art without creative work shall fall into the protection scope of the present disclosure.

Unless otherwise defined, technical or scientific terms used herein shall have ordinary meanings as understood by those of ordinary skill in the art to which the present disclosure pertains. The words "first", "second" and the like used in the description and the claims of present disclosure do not indicate any order, quantity or importance, but are only used to distinguish different components. The word "comprise" or "include" or the like means that an element or item appearing before such a word covers listed elements or items appearing after the word and equivalents thereof, and does not exclude other elements or items. The words "inner", "outer", "up", "down", and the like are only used to indicate a relative positional relationship. When the absolute position of a described object changes, the relative positional relationship may also change accordingly.

Figure 1B:
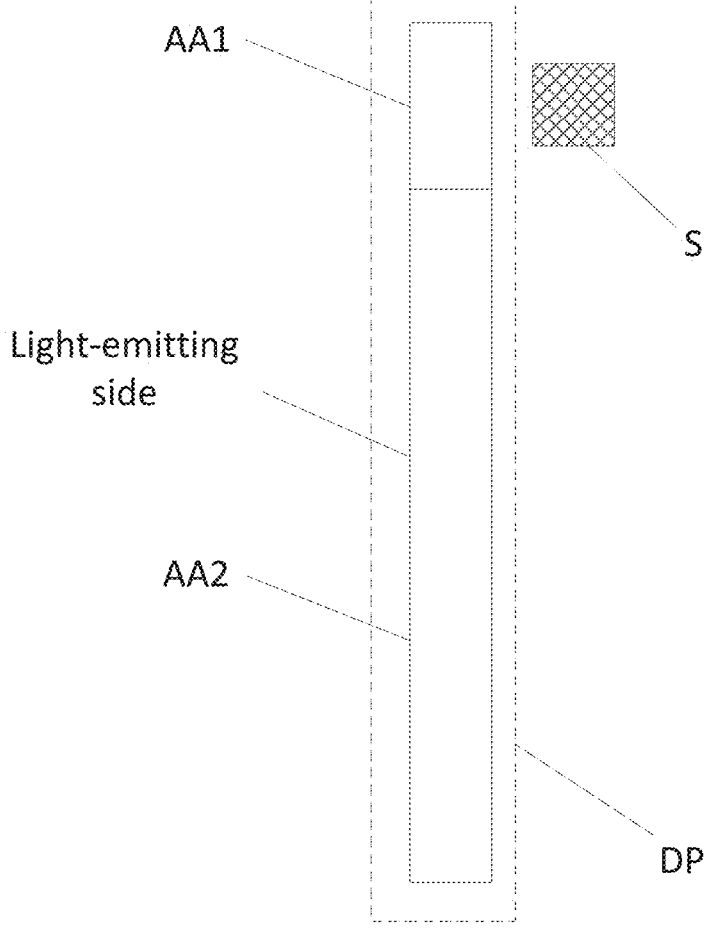
FIG. 1B is a side view of the display device shown in FIG. 1A.
Figure 2:
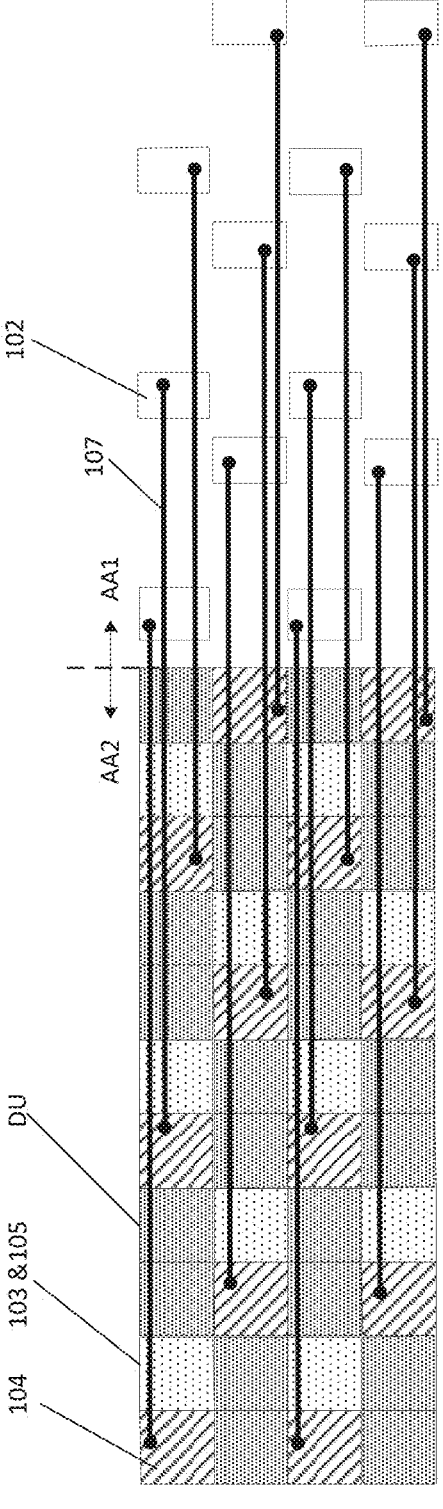
FIG. 2 is a schematic diagram of an enlarged structural of an area a in FIG. 1.

As shown in FIGS. 1 and 2, embodiments of the present disclosure provide a display device including: a display panel DP, and a sensor S arranged on a side of the display panel DP facing away from the light-emitting side of the display panel DP, where the sensor S can be a camera. The display panel includes a first display area AA1 and a second display area AA2, and the camera may be provided at the position of the first display area AA1. In some embodiments, a plurality of first pixel driving circuits 104, a plurality of second pixel driving circuits 105, and a plurality of dummy pixel driving circuits DU are provided in the second display area AA2. The second display area AA2 further includes a plurality of second light-emitting devices 103, the second light-emitting devices 105 are electrically connected with the second pixel driving circuits 105, and the second light-emitting device 103 is at least partially overlap with the second pixel driving circuit 105 connected with the second light-emitting device 103 (in FIG. 4, the second light-emitting device 103 is illustrated as completely overlapping with the second pixel driving circuit 105).

It should be noted that the dummy pixel driving circuit DU is not electrically connected to any light-emitting devices. The dummy pixel driving circuit DU is formed simultaneously with the production of the first pixel driving circuit 104 and the second pixel driving circuit 105. That is, the dummy pixel driving circuits DU are arranged on the positions of the display substrate where the first pixel driving circuits 104 and the second pixel driving circuits 105 are not arranged, which can ensure the uniformity of the display substrate film layer and does not require adjustment of the mask plate, thereby achieving the simultaneous formation of the first pixel driving circuit 104, the second pixel driving circuit 105, and the dummy pixel driving circuit DU on the base substrate through the same mask plates.

The plurality of first light-emitting devices 102 are provided in the first display area AA1, and each first light-emitting device 102 is electrically connected with the first pixel driving circuit 104 located in the second display area AA2 via a trace 107. That is, in the first display area AA1, the first pixel driving circuit 104 for driving the first light-emitting device 102 is not provided, but is arranged in the second display area AA2. The first light-emitting device 102 is electrically connected with the first pixel driving circuit 104 located in the second display area AA2 via the trace 107.

Figure 3:
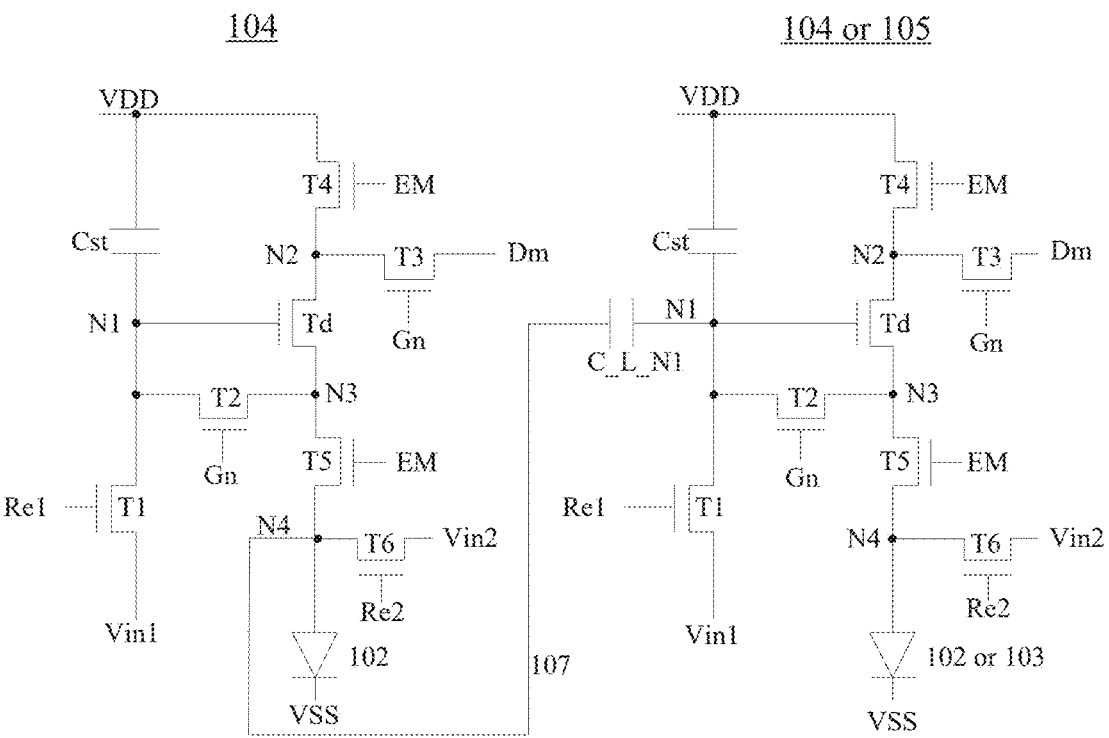
FIG. 3 is a schematic diagram of two pixel driving circuits provided in an embodiment of the present disclosure.

In some embodiments, the pixel driving circuits (first pixel driving circuit 104 and/or second pixel driving circuit 105) provided in the disclosed embodiment can adopt a 7T1C pixel driving circuit structure as shown in FIG. 3. As shown in FIG. 3, both the first pixel driving circuit 104 and the second pixel driving circuit 105 are provided with the driving transistors Td. As shown in FIG. 2, the first pixel driving circuit 104 located in the second display area AA2 needs to be electrically connected with the first light-emitting device 102 located in the first display area AA1 via the trace 107 that spans multiple pixel driving circuits (may include the first pixel driving circuit 104 and/or the second pixel driving circuit 105). When the orthographic projection of the trace 107 on the base substrate overlaps with the orthographic projection of the gate electrode of the driving transistor Td (i.e. node N1) in the pixel driving circuit on the base substrate, the trace 107 will form a capacitor with the gate electrode of the driving transistor Td or the gate connecting electrode (i.e. node N1), which will affect the gate voltage of the driving transistor Td and cause a change in the brightness of the light-emitting device electrically connected with the pixel driving circuit.

In some embodiments, the pixel driving circuit is described in detail here with a 7T1C structure shown in FIG. 3 as an example. In the pixel driving circuit of the 7T1C structure shown in FIGS. 3, T1 to T6, and Td represent different transistors, Cst represents a storage capacitor, N1 to N4 represent different nodes.

In some embodiments, a process of driving the light-emitting device to emit light by the pixel driving circuit of the 7T1C structure shown in FIG. 3may be divided into the following three stages:

in a first stage, a first transistor T1 is turned on under the control of a reset signal terminal Re1, such that a first initialization signal terminal Vin1 resets the gate of the drive transistor Td (i.e., a node N1), and the other transistors are in an off state;

in a second stage, a second transistor T2 and a third transistor T3 are turned on under the control of a scanning signal terminal Gn, a signal of a data signal terminal Dm is written to a node N2 via the third transistor T3, and a threshold of the drive transistor Td is compensated by the second transistor T2: furthermore, a sixth transistor T6 is turned on under the control of a second reset signal terminal Re2, such that a second initialization signal terminal Vin2 resets an anode of the light-emitting device 102 or 103 (i.e., a node N4), and the other transistors are in an off state;

in a third stage, a fourth transistor T4 and a fifth transistor T5 are turned on under the control of a light emission control signal terminal EM, and at that time, the drive transistor Td is also in an on state due to the presence of the storage capacitor Cst, thereby providing a drive current to the light-emitting device 102 or 103;

however, When the orthographic projection of the trace 107 on the base substrate overlaps with the orthographic projection of the gate electrode of the driving transistor Td (i.e. node N1) in the pixel driving circuit on the base substrate, the trace 107 will form a parasitic capacitance C_L_N1 with the gate electrode of the driving transistor Td or the gate connecting electrode (i.e. node N1), and the voltage of the node N1 jumps after a signal of the light emission control signal terminal EM is turned on, and brightness unevenness occurs because the capacitance between the trace 107 and the node N1 contained in each of the plurality of pixel driving circuits is not completely same.

It should be noted that the parasitic capacitance C_L_N1 shown in FIG. 3 does not belong to any actual capacitor structure in the pixel driving circuit, and the N4 node of the first pixel driving circuit 104 is not connected with the N1 node of the pixel driving circuit 104 or 105. FIG. 3 is only to illustrate that the trace 107 can overlap with the N1 node of the pixel driving circuit 104 or 105, and the overlapping area can form the parasitic capacitance C_L_N1.

In addition, the disclosed embodiment is only illustrated using the 7T1C pixel driving circuit shown in FIG. 3 as an example, and does not limit the specific structure of the pixel driving circuit. The disclosed embodiment can adopt any pixel driving circuit that meets the driving requirements in related art, and is not limited here.

Figure 4:
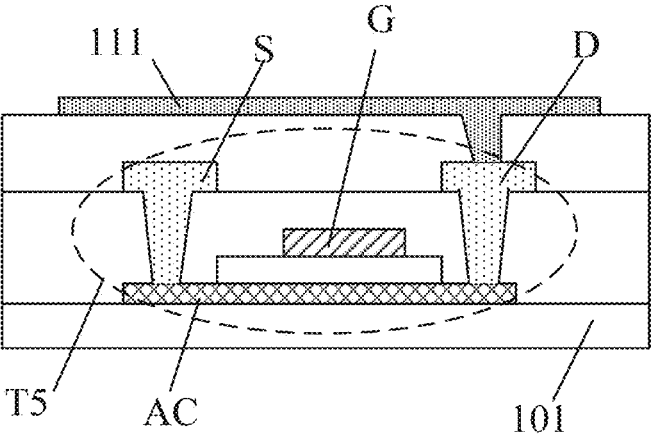
FIG. 4 is a schematic diagram of the structure of the connection between the fifth transistor of the second pixel driving circuit and the anode of the second light-emitting device.

FIG. 4 shows a schematic diagram of the structure of the fifth transistor T5 and the anode 111 connected in the second pixel driving circuit 105. The fifth transistor T5 includes an active layer AC, a gate electrode G on a side of the active layer AC facing away from the base substrate 101, and a source electrode S and a drain electrode D on a side of the gate electrode G facing away from the base substrate 101. The source electrode S and the drain electrode D are arranged in the same layer and are electrically connected to the active layer AC. The second light-emitting device 103 includes an anode 111 on a side of the layer where the source electrode S and the drain electrode D are located, facing away from the base substrate 101. The anode 111 is electrically connected with the drain electrode D.

In view of the above technical problems, an embodiment of the present disclosure provides a display substrate, as shown in FIGS. 1, 2, 5 to 7, 8A and 8B, which includes:

a base substrate 101, a display area AA of the base substrate 101 including a first display area AA1 and a second display area AA2, an light transmittance of the first display area AA1 is greater than an light transmittance of the second display area AA2;

a plurality of light-emitting devices EL arranged in an array on the base substrate 101, the plurality of light-emitting devices EL including a plurality of first light-emitting devices 102 located in the first display area AA1 and a plurality of second light-emitting devices 103 located in the second display area AA2;

a plurality of pixel driving circuits D disposed between the base substrate 101 and a layer where the plurality of light-emitting devices EL are located, the plurality of pixel driving circuits D including a plurality of first pixel driving circuits 104 and a plurality of second pixel driving circuits 105, the plurality of first pixel driving circuits 104 are correspondingly electrically connected to the plurality of first light-emitting devices 102, and the plurality of second pixel driving circuits 105 are at least partially overlapped with and correspondingly electrically connected to the plurality of second light-emitting devices 103 (as shown in FIG. 4, t the orthographic projection of transistor T5 in the second pixel driving circuit 105 on the base substrate 101 is overlapped with the orthographic projection of the anode 111 of the second light-emitting device 103 on the base substrate 101); and at least one of the plurality of pixel driving circuits D is provided with a drive transistor Td;

a gate connecting electrode 106 (i.e., a node N1) connected to a gate electrode of the drive transistor;

a plurality of traces 107 disposed between a layer where the plurality of pixel driving circuits D are located and the layer where the plurality of light-emitting devices EL are located, each of at least part of the traces 107 being electrically connected from at least one of the first pixel driving circuits 104 across at least one of the gate connecting electrode 106 to at least one of the first light-emitting devices 102, respectively; and a shielding layer 108 including a plurality of isolation parts 1081, an orthographic projection of at least one of the isolation parts 1081 on the base substrate 101 at least partially overlapping an orthographic projection of at least one of the gate connecting electrode 106 (i.e., the node N1) on the base substrate 101.

In some embodiments, when the at least part of the traces 107 crosses the at least one gate connecting electrode 106

(i.e., the node N1), the isolation part 1081 can effectively shield a signal on the trace 107 from interfering with a voltage on the gate connecting electrode 106 contained in the drive transistor Td, so that a drive current provided by the pixel driving circuit D in which the gate connecting electrode 106 (i.e., the node N1) is located does not jump, thus improving the uniformity of the luminous brightness.

It is to be noted that the shape of the first display area AA1 in the present disclosure may be a square as shown in FIG. 1, or other shape such as a circle, which may be designed according to actual needs and is not be limited here. The second display area AA2 may surround the periphery of the first display area AA1, or may surround part of the first display area AA1 as shown in FIG. 1, for example, surrounding left, lower and right sides of the first display area AA1, while an upper border of the first display area AA1 coincides with an upper border of the second display area AA2.

Figures 9, 10:
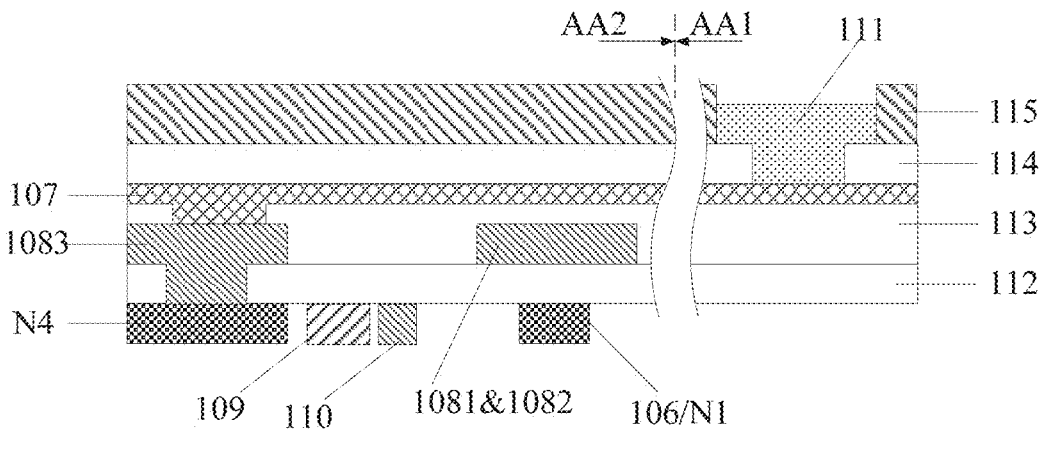
FIG. 9 is a sectional structural diagram a display substrate provided in an embodiment of the present disclosure.
FIG. 10 is another sectional structural diagram a display substrate provided in an embodiment of the present disclosure.

In some embodiments, as shown in FIGS. 9 and 10, to achieve a good shielding effect, the shielding layer 108 including the plurality of isolation parts 1081 may be disposed between a layer where the at least part of the traces 107 is located and a layer where the gate connecting electrode 106 is located.

Figure 5:
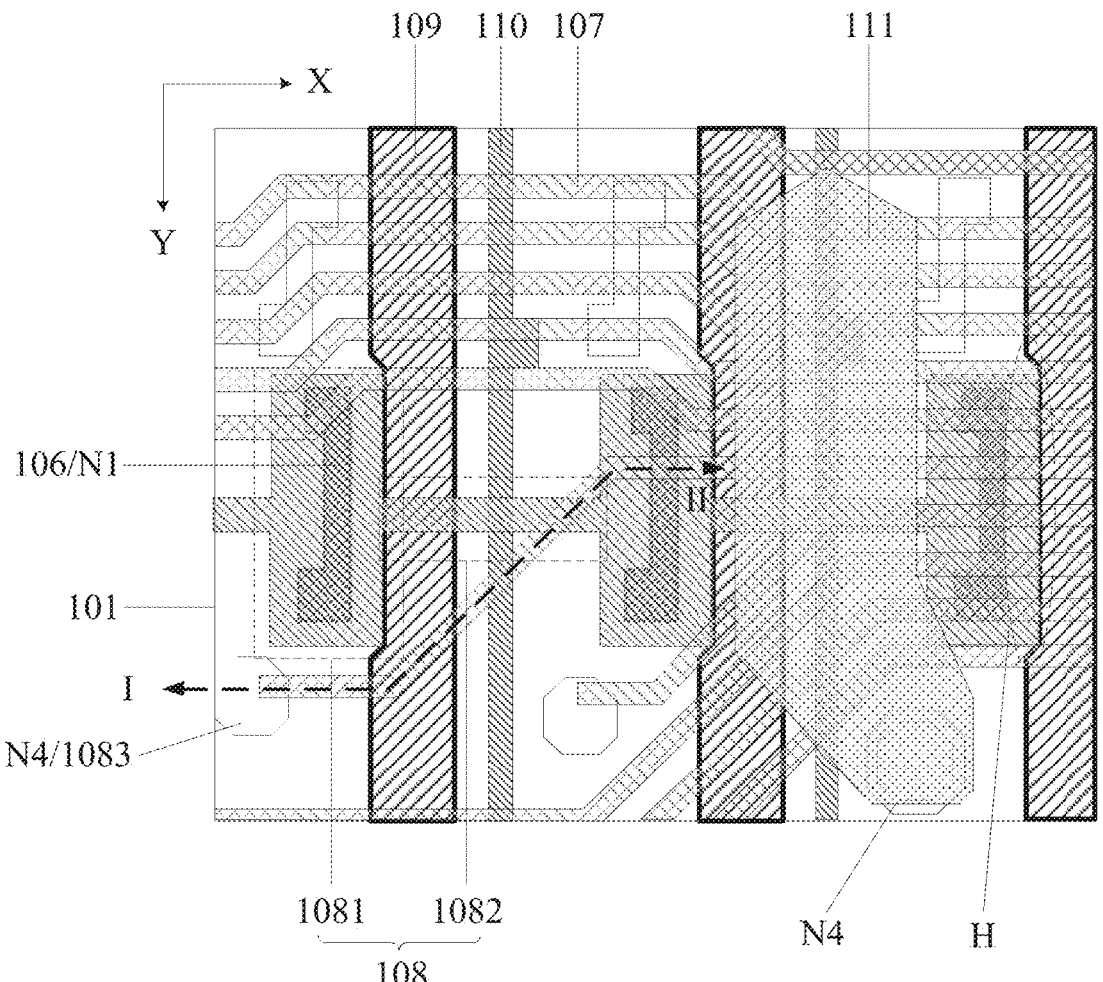
FIG. 5 is a schematic diagram of a structure of a part of the second display area of a display substrate provided in an embodiment of the present disclosure.
Figure 6A:
FIG. 6A is a schematic diagram of the structure of the gate connecting electrodes 106/N1 shown in FIG. 5.
Figure 6B:
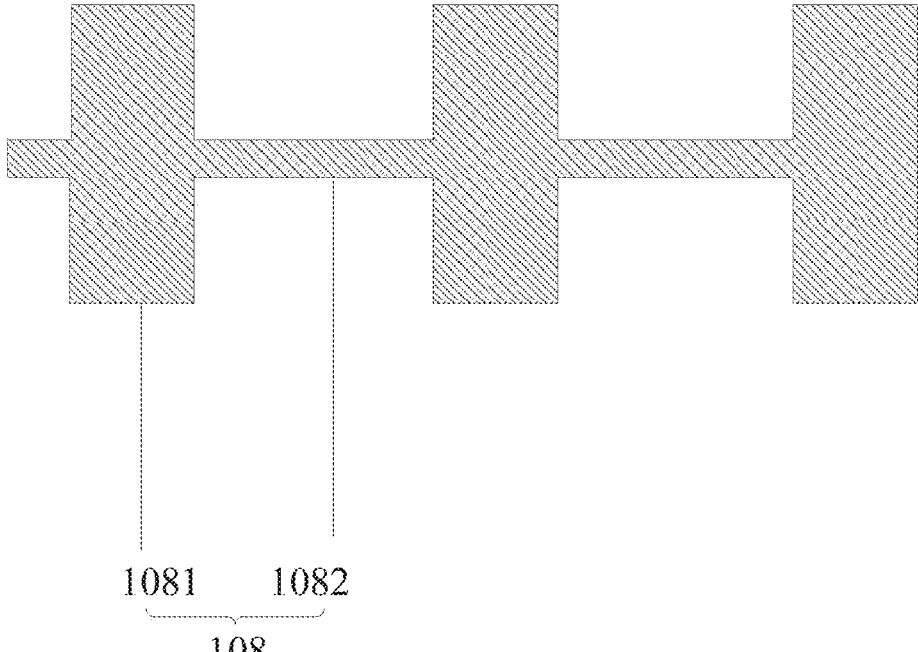
FIG. 6B is a schematic diagram of the structure of the shielding layer 108 and the gate connecting electrode 106/N1 shown in FIG. 5.
Figure 7:
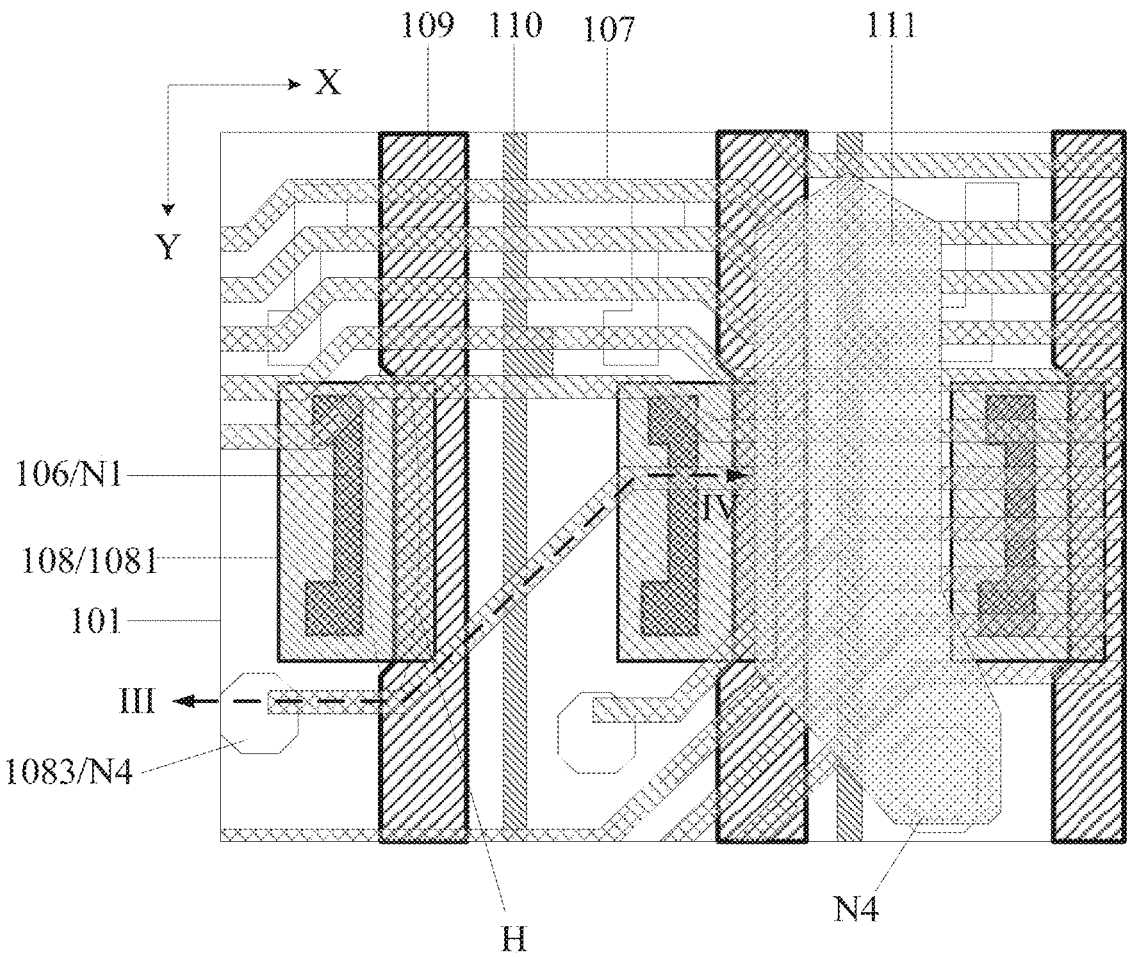
FIG. 7 is another schematic structural diagram of a part of the second display area of a display substrate provided in an embodiment of the present disclosure.

In some embodiments, as shown in FIGS. 5, 6A and 7, each of the gate connecting electrode 106 (i.e., the node N1) is arranged in a first direction X and extends in a second direction Y. And, as shown in FIGS. 5, 6B and 7, each of the isolation part 1081 is also arranged in the first direction X and extends in the second direction Y, to better shield the signal on the trace 107 from interfering with the gate connecting electrode 106 (i.e., the node N1).

In some embodiments, in order to achieve the shielding effect of the shielding parts 1081, the material of the shielding layer 108 may be a metal material such as copper, molybdenum or aluminum, or a transparent conductive material such as indium tin oxide (ITO), having a shielding property itself. Furthermore, in some implementations, the isolation parts 1081 may be disposed in a floating manner (not applied with a signal) or applied with a DC signal. In some embodiments, the DC signal may be a high level (VDD) signal, a low level (VSS) signal, an initialization (Vin) signal, or the like.

In some embodiments, as shown in FIGS. 5 and 6B, the shielding layer 108 may further include a plurality of connection parts 1082, each of the connection parts 1082 connecting two of the isolation parts 1081 in the first direction X. A same row of isolation parts 1081 may be connected into an integral structure by the connection parts 1082, to facilitate applying the DC signal to the isolation parts 108. Of course, a wire may also be provided separately for each isolation part 1081 respectively to correspondingly apply the DC signal thereto, which is not limited here.

In some embodiments, as the connection parts 1082 may overlap other conductive film layers to generate a parasitic capacitance, thus, to minimize the parasitic capacitance, the width of the connection parts 1082 may be smaller than the width of the isolation parts 1081 in the second direction Y, as shown in FIGS. 5 and 6B.

In the present disclosure, the plurality of traces 107 may be arranged in a same layer or may be arranged in different layers. Furthermore, as shown in FIG. 2, as each trace 107 extending along the row direction has a certain width in the column direction, and each pixel also has a certain dimension in the column direction, the number of pixels in each row in the first display area AA1 is limited: however, in the case where the plurality of traces 107 are provided in different layers, more traces 107 may be provided within a certain dimensional range in the column direction to drive more first light-emitting devices 102, thereby achieving the same resolution of the first display area AA1 and the second display area AA2, thus improving the overall display effect.

Figure 6C:
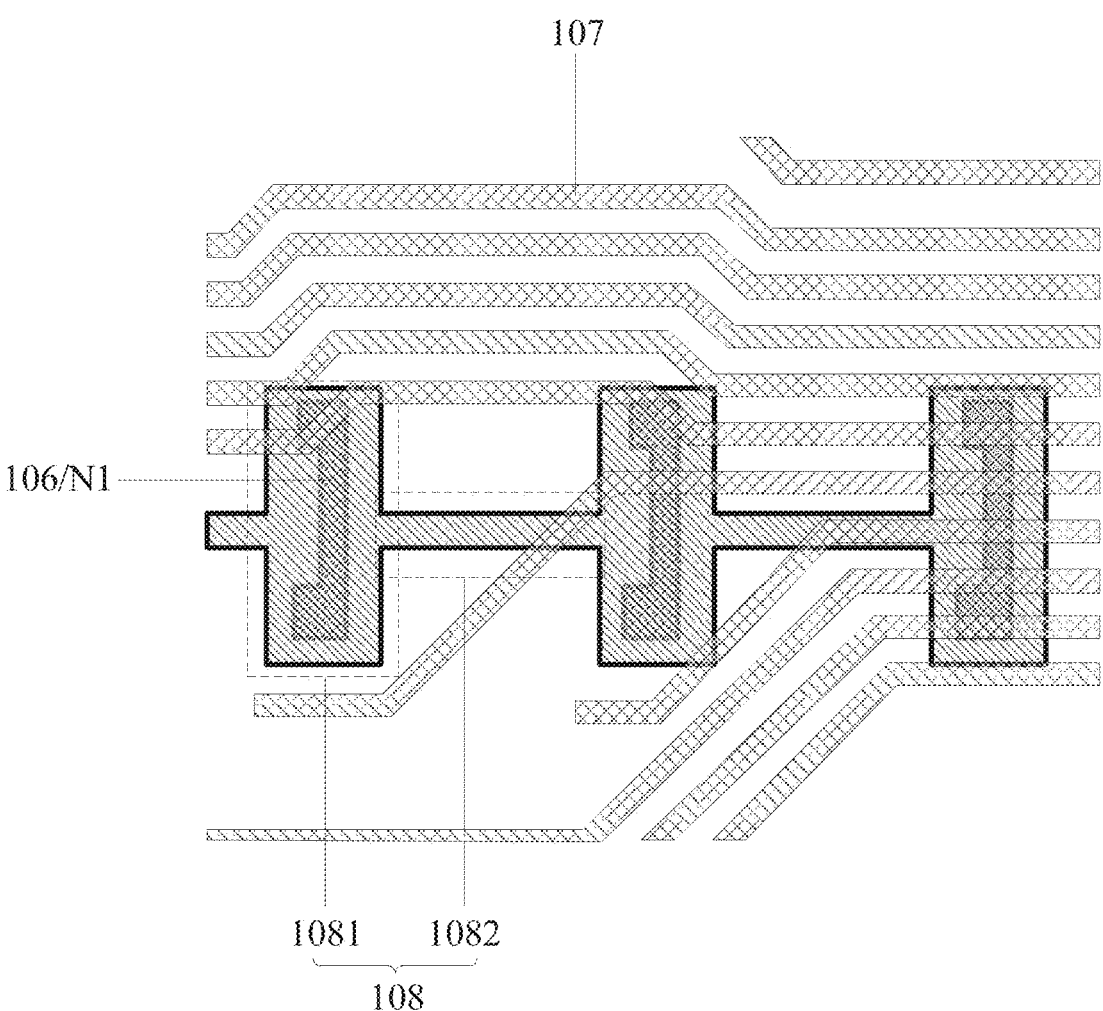
FIG. 6C is a schematic diagram of the structure of the shielding layer 108, the gate connecting electrode 106/N1, and the traces 107 shown in FIG. 5.
Figure 6D:
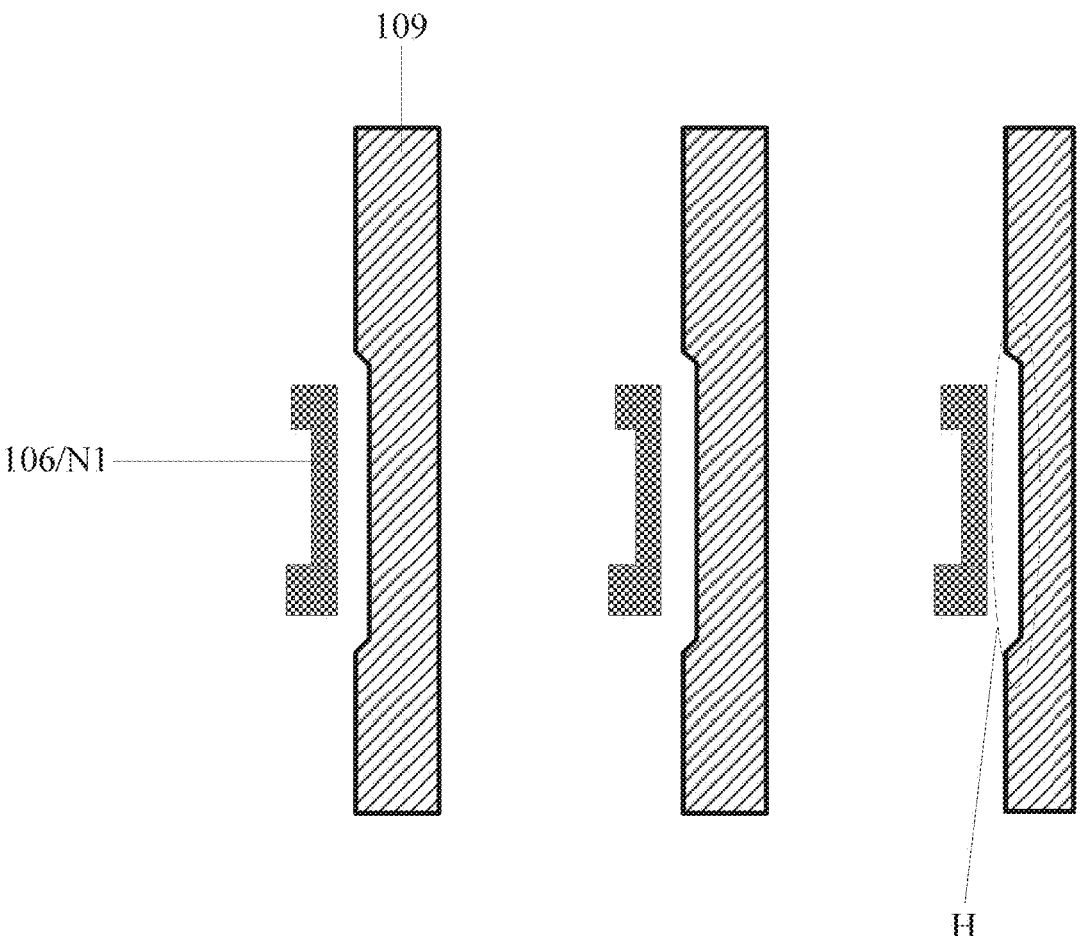
FIG. 6D is a schematic diagram of the structure of the gate connecting electrode 106/N1 and the power signal line 109 shown in FIG. 5.
Figure 6E:
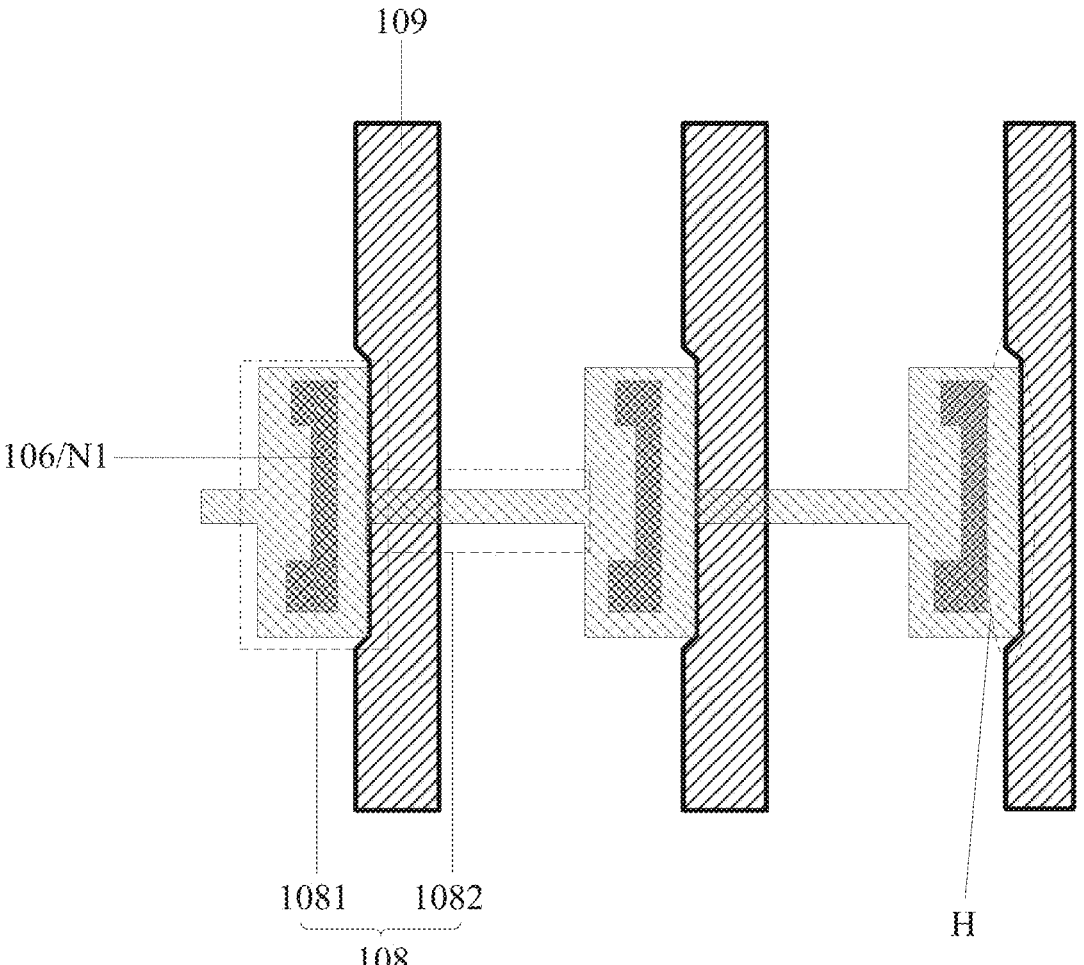
FIG. 6E is a schematic diagram of the structure of the gate connecting electrode 106/N1, shielding layer 108, and power signal line 109 shown in FIG. 5.
Figure 6F:
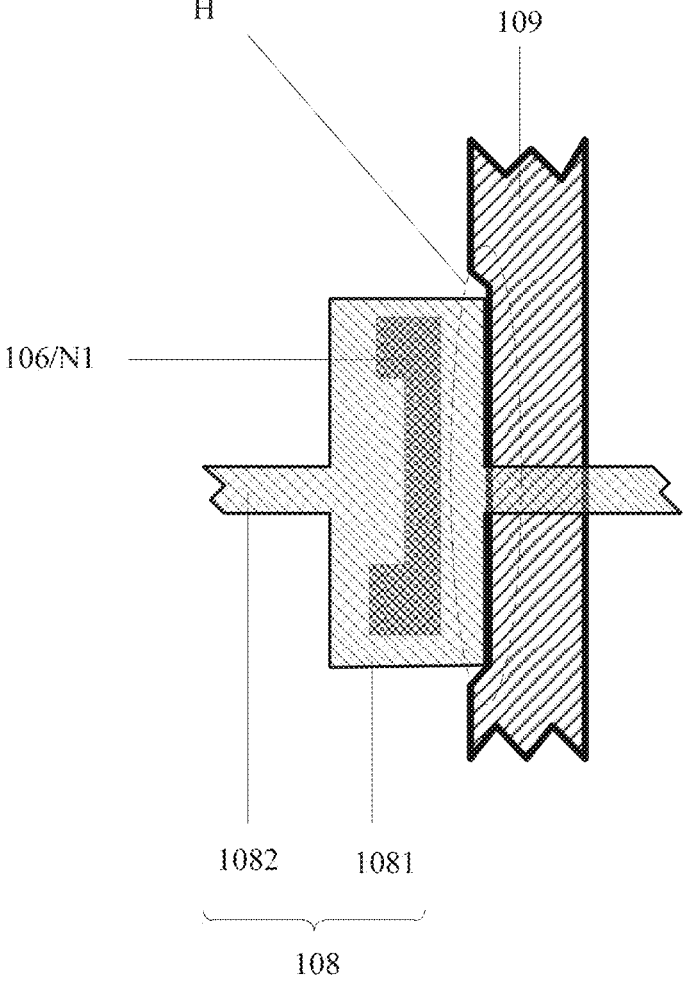
FIG. 6F is a partial enlarged schematic diagram of the structure of the gate connecting electrode 106/N1, shielding layer 108, and power signal line 109 shown in FIG. 5.

In some embodiments, in the case where the plurality of traces 107 are provided in a same layer, as shown in FIGS. 9 and 6C, the shielding layer 108 may be disposed between a source-drain metal layer (a layer where the N4 node and N1node are located) and a layer where the plurality of traces 107 are located, and the shielding layer 108 may further include a plurality of conductive parts 1083 independent from the plurality of connection parts 1082 and the plurality of isolation parts 1081, each conductive part 1083 connects one of the traces 107 and one of the first pixel driving circuits 104 (i.e., the node N4 of the first pixel driving circuit 104), and the trace 107 extends to be electrically connected to the first light-emitting device 102 in the first display area AA.

In the case where the plurality of traces 107 are provided in different layers, as shown in FIG. 10, the shielding layer 108 may be provided in a same layer as a rest of the traces 107 (i.e., traces 107 not crossing the gate connecting electrode 106) other than the at least part of the traces 107 (i.e., traces 107 crossing the gate connecting electrode 106), and the shielding layer 108 may further include a plurality of conductive parts 1083 independent from the plurality of connection parts 1082 and the plurality of isolation parts 1081, wherein each conductive part 1083 connects one of the at least part of the traces 107 and one of the first pixel driving circuits (specifically, the node N4 of the first pixel driving circuit 104), and the trace 107 extends to be electrically connected to the first light-emitting device 102 in the first display area AA.

It should be noted that the cross-sectional view in the second display area AA2 in FIG. 9) is taken along the I-II line in FIG. 5 or the III-IV line in FIG. 7. The cross-sectional view in the first display area AA1 in FIG. 9 is not shown in FIG. 5 or FIG. 7, but only for the position and connection relationship of the film layer between the trace 107 and the anode 111 of the first light-emitting device 102. Similarly, the cross-sectional view within the second display area AA2 in FIG. 10 is taken along the I-II line in FIG. 5 or the III-IV line in FIG. 7. The cross-sectional view within the first display area AA1 in FIG. 10 is not shown in FIG. 5 or FIG. 7, but only for the position and connection relationship of the film layer between the .trace 107 and the anode 111 of the first light-emitting device 102.

Figure 8A:
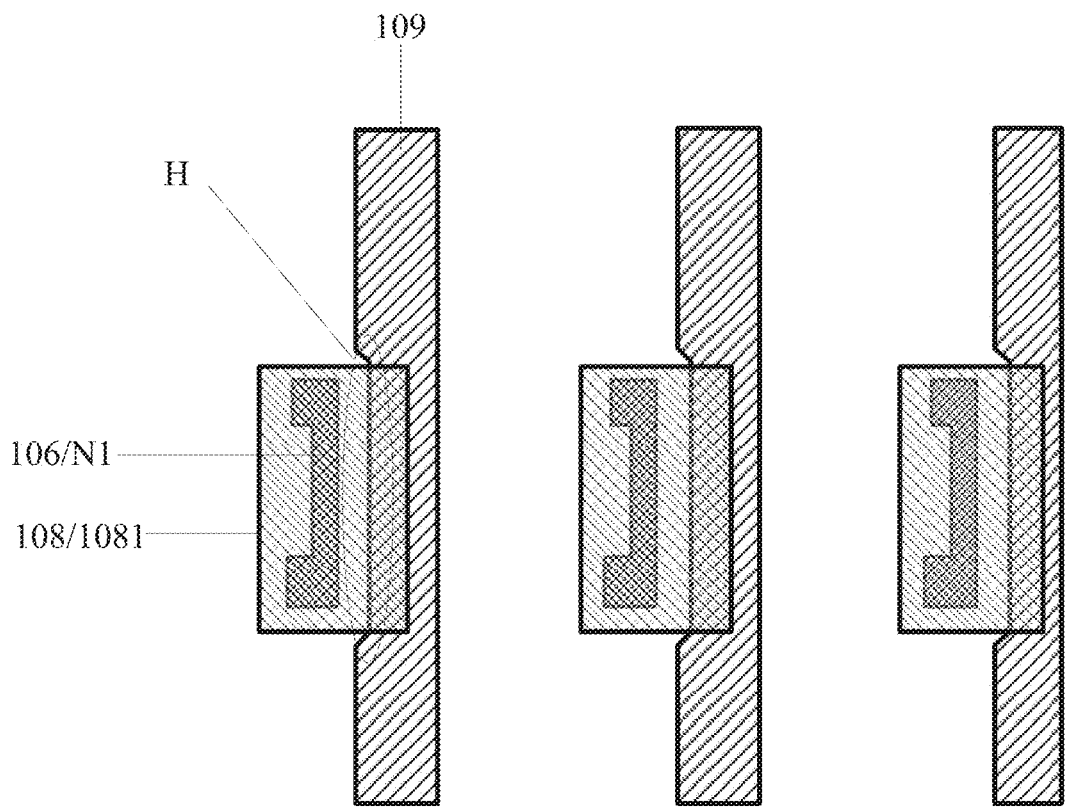
FIG. 8A is a schematic diagram of the structure of the gate connecting electrode 106/N1, isolation parts 1081 and the power signal line 109 shown in FIG. 7.
Figure 8B:
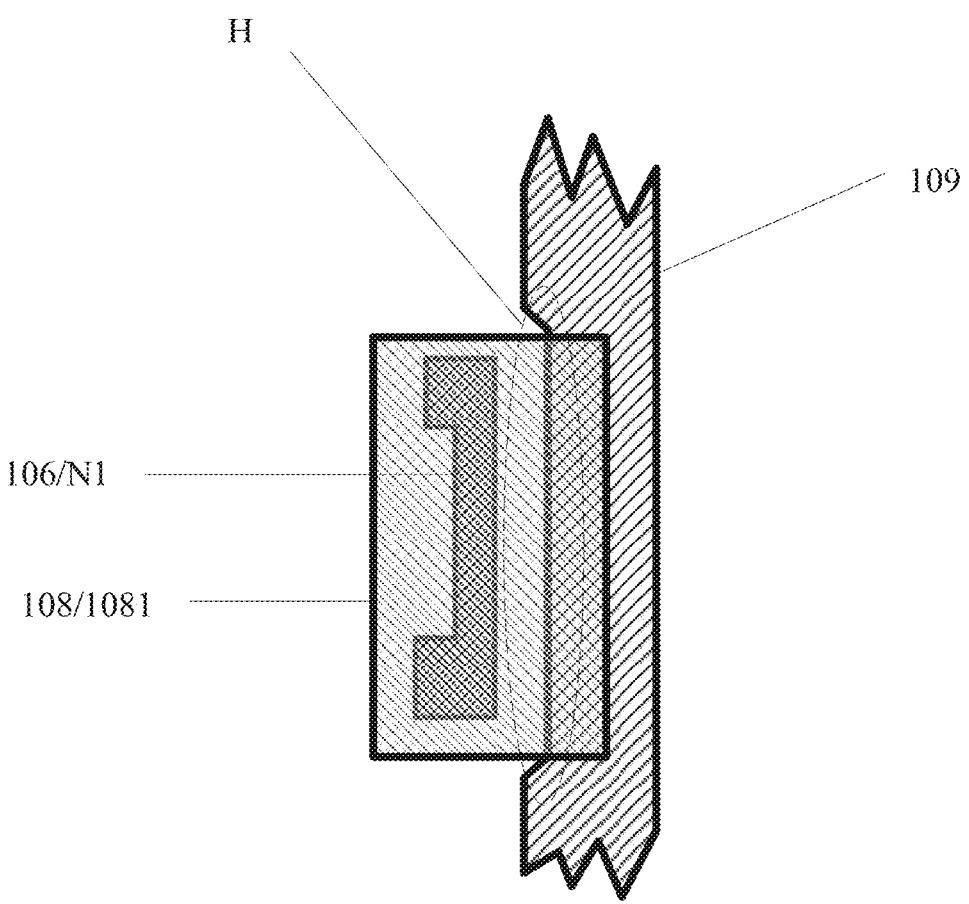
FIG. 8B is a partial enlarged schematic diagram of the structure of the gate connecting electrode 106/N1, shielding layer 108, and power signal line 109 shown in FIG. 7.

In some embodiments, as shown in FIGS. 7, 8A and 8B, the display substrate may further include a power signal line 109 located in a source-drain metal layer and disposed adjacent to the gate connecting electrode 106;

the power signal line 109 is provided with a concave structure H on a side close to the gate connecting electrode 106;

the isolation part 1081 is applied with a same signal (e.g., VDD signal) as the power signal line 109;

the orthographic projection of the isolation part 1081 on the base substrate 101 may cover an orthographic projection of the concave structure H; and the orthographic projection of the isolation part 1081 on the base substrate 101 partially overlap an orthographic projection of the power signal line 109.

In this case, the concave structure H of the power signal line 109 is mainly used to avoid the gate connecting electrode 106 (i.e., the node N1), thus avoiding mutual interference between signals on the power signal line 109 and the gate connecting electrode 106 (i.e., the node N1).

In some embodiments, as shown in FIGS. 5, 6D, 6E and 6F, the display substrate may further include a power signal line 109 located in a source-drain metal layer and disposed adjacent to the gate connecting electrode 106;

the power signal line 109 is provided with a concave structure H on a side close to the gate connecting electrode 106;

the orthographic projection of the isolation part 108 on the base substrate 101 overlaps an orthographic projection of the concave structure H; and the orthographic projection of the isolation part 108 on the base substrate 101 does not overlap an orthographic projection of the power signal line 109.

By providing the concave structure H that avoids the isolation part 108 on the power signal line 109, mutual interference between the signals on the power signal line 109 and the gate connecting electrode 106 (i.e., the node N1), and the signal on the isolation part 108, respectively, is avoided.

It is to be noted that in the present disclosure, the source-drain metal layer may refer to a metal layer where a source and a drain of the drive transistor are located. In some embodiments, the gate connecting electrode 106 may be located in the source-drain metal layer.

In some embodiments, as shown in FIG. 2, the density of the plurality of first light-emitting devices 102 in the first display area AA1 may be smaller than the density of the plurality of second light-emitting devices 103 in the second display area AA2; and accordingly, the plurality of first pixel driving circuits 104 correspondingly electrically connected to the plurality of first light-emitting devices 102, and the plurality of second pixel driving circuits 105 correspondingly electrically connected to the plurality of second light-emitting devices 103 are both located in the second display area AA2, and each of the first pixel driving circuits 104 is located in a gap between two of the second pixel driving circuits 105.

Figure 11:
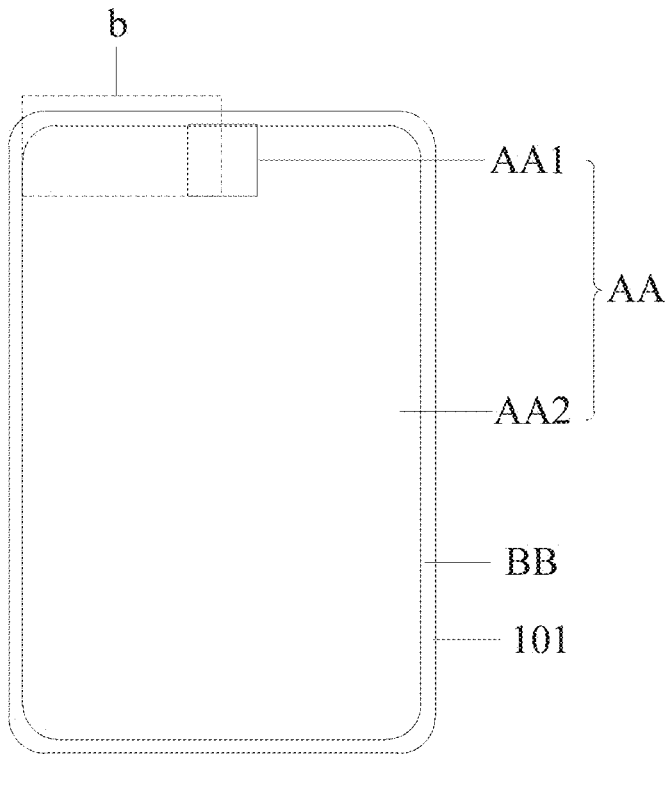
FIG. 11 is another structural diagram of a display device provided in an embodiment of the present disclosure.
Figure 12:
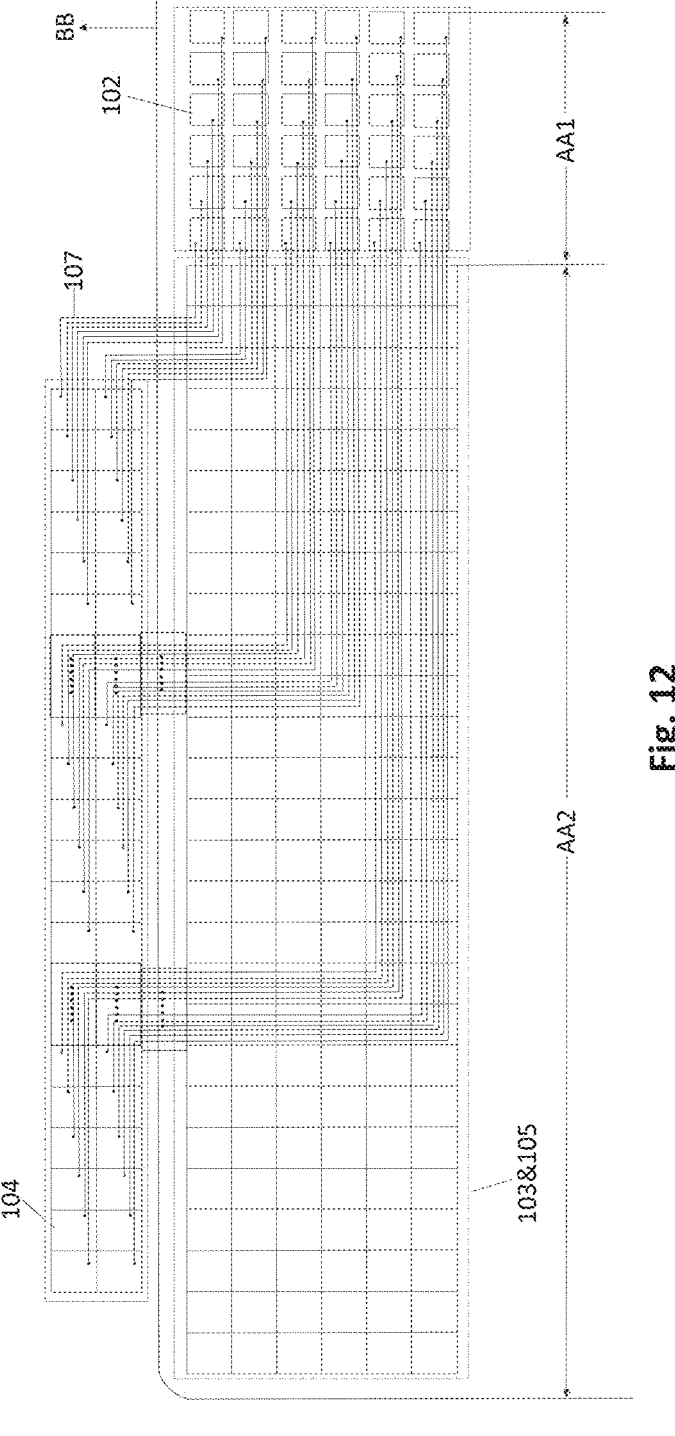
FIG. 12 is a schematic diagram of an enlarged structural of an area b in FIG. 11.

In some embodiments, as shown in FIGS. 11 and 12, the density of the plurality of first light-emitting devices 102 in the first display area AA1 may also be equal to the density of the plurality of second light-emitting devices 103 in the second display area AA2; and accordingly, the plurality of first pixel driving circuits 104 correspondingly electrically connected to the plurality of first light-emitting devices 102 are located in a border area BB adjacent to the first display area AA1, and the plurality of second light-emitting devices 105 correspondingly electrically connected to the plurality of second light-emitting devices 103 are located in the second display area AA2. In some embodiments, a middle area of the first display area AA1 may be an area where a camera is located, and only the first light-emitting devices EL are provided in the middle area, and an edge area of the first display area AA1 is provided with the first pixel driving circuits 104, the second pixel driving circuits 105, and second light-emitting devices 103 at least partially over-lapped with the second pixel driving circuits 105: the second display area AA2 is a normal display area and is provided with the second pixel driving circuits 105, and second light-emitting devices 103 at least partially overlapped with the second pixel driving circuits 105. The density of the second light-emitting devices 103 in the edge area of the first display area AA1 is greater than the density of the first light-emitting devices 102 in the middle area of the first display area AA1, and the density of the second light-emitting devices 103 in the edge area of the first display area AA1 is smaller than the density of the second light-emitting devices 103 in the second display area AA2.

In addition, the above-mentioned display substrate provided in embodiment of the present disclosure, as shown in FIGS. 5, 7, 9 and 10, the display substrate may further include: a data line 110 located in the source-drain metal layer, a plurality of anodes 111 located above the plurality of traces 107, a first insulating layer 112 located between the source-drain metal layer and the shielding layer 108, a second insulating layer 113 located between the shielding layer 108 and the layer where the at least part of the traces 107 is located, a planarization layer 114 located between the layer where the at least part of the traces 107 is located and a layer where the plurality of anodes 111 are located, and a pixel defining layer 115 defining the location of the plurality of anodes 111. Other indispensable components are present as understood by those of ordinary skill in the art, and are not described here, nor should they be construed as limiting the present disclosure.

It should be noted that FIGS. 5 and 7 show the partial circuit structure within the second display area AA2 of the display substrate. Therefore, the anode 111 shown in FIGS. 5 and 7 is the anode 111 of the second light emitting device 103, which does not need to be electrically connected with the second pixel driving circuit 105 via the trace 107. The anode 111 of the second light emitting device 103 can be directly electrically connected with the N4 node of the second pixel driving circuit 105. In FIGS. 9 and 10, the anode 111 in the first display area AA1 is the anode 111 of the first light-emitting device 102, which needs to be electrically connected with the first pixel driving circuit 104 located in the second display area AA2 via the trace 107.

In some embodiments, the first display area AA1 is configured to install a light extraction module, such as a camera module, an optical fingerprint recognition module, or an ambient light sensor.

In some embodiments, the material of the plurality of traces 107 may be a transparent conductive material to improve the light transmittance of the first display area AA1.

In some embodiments, the pixel driving circuits can further include a threshold compensation transistor, and the gate connecting electrode 106 may be further electrically connected to a drain of the threshold compensation transistor. By providing the gate connecting electrode 10) to connect the gate of the drive transistor and the drain of the threshold compensation transistor, the threshold compensation transistor may compensate the threshold of the drive transistor, thus effectively avoiding different driving currents caused by different thresholds of the drive transistors contained in different pixel driving circuits, thereby ensuring the uniformity of the luminous brightness.

In another aspect, an embodiment of the present disclosure further provides a display panel including the above-mentioned display substrate provided in embodiments of the present disclosure.

In some embodiments, the display panel may be an organic electroluminescent display panel (OLED), a quantum dot light-emitting display panel (QLED), or a micro light-emitting diode display panel (Micro LED). The problem-solving principle of the display panel is similar to that of the above-mentioned display substrate, and thus for the implementation of the display panel provided in embodiments of the present disclosure, reference may be made to the implementation of the above-mentioned display substrate provided in embodiments of the present disclosure, and repeated description is omitted.

In yet another aspect, an embodiment of the present disclosure further provides a display device including a light extraction module (such as a camera module) and the above-mentioned display panel, the light extraction module is provided in a first display area AA1 of the display panel.

The display device may be a mobile phone, a tablet computer, a television, a display, a notebook computer, a digital photo frame, a navigator, a smart watch, a fitness wristband, a personal digital assistant or any other product or component with a display function. Other indispensable components of the display device are present as understandable by those skilled in the art, and are not described here, nor should they be construed as limiting the present disclosure. In addition, the problem-solving principle of the display device is similar to that of the above-mentioned display panel, and thus for the implementation of the display device, reference may be made to the implementation of the above-mentioned display panel, and repeated description is omitted.

Evidently, those skilled in the art can make various modifications and variations to the embodiments of the present disclosure without departing from the spirit and scope of the embodiments of the present disclosure. Thus, the present disclosure is also intended to encompass these modifications and variations to the embodiments of the present disclosure so long as the modifications and variations come into the scope of the claims appended to the present disclosure and their equivalents.

What is claimed is:

1. A display substrate, comprising:

a base substrate, wherein a display area of the base substrate comprises a first display area and a second display area, a light transmittance of the first display area is greater than a light transmittance of the second display area;

a plurality of light-emitting devices, arranged in an array on the base substrate, the plurality of light-emitting devices comprising a plurality of first light-emitting devices located in the first display area and a plurality of second light-emitting devices located in the second display area;

a plurality of pixel driving circuits, disposed between the base substrate and a layer where the plurality of light-emitting devices are located, wherein the plurality of pixel driving circuits comprise a plurality of first pixel driving circuits and a plurality of second pixel driving circuits, the plurality of first pixel driving circuits are correspondingly electrically connected to the plurality of first light-emitting devices, orthographic projections of the plurality of first pixel driving circuits on the base substrate do not overlap with the first display area; and the plurality of second pixel driving circuits are at least partially overlapped with and correspondingly electrically connected to the plurality of second light-emitting devices; and at least one of the plurality of pixel driving circuits is provided with a drive transistor;

gate connecting electrodes, connected to a gate electrode of the drive transistor;

a plurality of traces, disposed between a layer where the plurality of pixel driving circuits are located and the layer where the plurality of light-emitting devices are located, each of at least part of the traces being electrically connected, from at least one of the first pixel driving circuits and across at least one of the gate connecting electrodes, to at least one of the first light-emitting devices; and a shielding layer, comprising a plurality of isolation parts, an orthographic projection, on the base substrate, of at least one of the isolation parts at least partially overlapping an orthographic projection, on the base substrate, of at least one of the gate connecting electrodes;

wherein the gate connecting electrodes are arranged in a first direction and extend in a second direction, and the isolation parts are arranged in the first direction and extend in the second direction;

the shielding layer further comprises a plurality of connection parts, and each of the connection parts connects two of the isolation parts in the first direction;

in the second direction, a width of the isolation parts is greater than a width of the connection parts;

wherein the shielding layer is disposed between a source-drain metal layer and a layer where the plurality of traces are located;

the shielding layer further comprises a plurality of conductive parts independent from the plurality of connection parts and the plurality of isolation parts; and the conductive parts each connects a respective one of the traces and a respective one of the first pixel driving circuits.

2. The display substrate of claim 1, wherein the shielding layer is disposed between a layer where the at least part of the traces is located and a layer where the gate connecting electrodes are located.

3. The display substrate of claim 1, wherein the shielding layer is arranged in a same layer as a rest of the traces other than the at least part of the traces;

the shielding layer further comprises a plurality of conductive parts independent from the plurality of connection parts and the plurality of isolation parts; and the conductive parts each connects a respective one of the at least part of the traces and a respective one of the first pixel driving circuits.

4. The display substrate of claim 1, wherein the isolation parts are disposed in a floating manner or applied with a DC signal.

5. The display substrate of claim 1, further comprising a power signal line located in a source-drain metal layer and disposed adjacent to the gate connecting electrodes; wherein the power signal line is provided with a concave structure on a side close to the gate connecting electrodes;

the isolation parts are applied with a same signal as the power signal line;

orthographic projections, on the base substrate, of the isolation parts cover an orthographic projection of the concave structure; and the orthographic projections, on the base substrate, of the isolation parts partially overlap an orthographic projection of the power signal line.

6. The display substrate of claim 1, further comprising a power signal line located in a source-drain metal layer and disposed adjacent to the gate connecting electrodes; wherein the power signal line is provided with a concave structure on a side close to the gate connecting electrodes;

orthographic projections, on the base substrate, of the isolation parts overlap an orthographic projection of the concave structure; and the orthographic projections, on the base substrate, of the isolation parts do not overlap an orthographic projection of the power signal line.

7. The display substrate of claim 1, wherein a density of the plurality of first light-emitting devices in the first display area is smaller than a density of the plurality of second light-emitting devices in the second display area; and the plurality of pixel driving circuits are located in the second display area, and each of the first pixel driving circuits is located in a gap between two of the second pixel driving circuits.

8. The display substrate of claim 1, wherein a density of the plurality of first light-emitting devices in the first display area is equal to a density of the plurality of second light-emitting devices in the second display area;

the plurality of first pixel driving circuits are located in a border area adjacent to the first display area; and the plurality of second pixel driving circuits are located in the second display area.

9. The display substrate of claim 1, wherein the first display area is configured to install a light extraction module.

10. The display substrate of claim 1, wherein a material of the plurality of traces is a transparent conductive material.

11. The display substrate of claim 1, wherein the pixel driving circuits further comprise a threshold compensation transistor; and the gate connecting electrodes are electrically connected to a drain of the threshold compensation transistor.

12. A display panel, comprising the display substrate of claim 1.

13. A display device, comprising a light extraction module, and the display panel of claim 12;

wherein the light extraction module is provided in a first display area of the display panel.

14. The display panel of claim 12, wherein the shielding layer is disposed between a layer where the at least part of the traces is located and a layer where the gate connecting electrodes are located.

* * * * *